United States Patent
Oh et al.

(10) Patent No.: US 11,307,918 B2
(45) Date of Patent: Apr. 19, 2022

(54) MEMORY CONTROLLER PERFORMING RECOVERY OPERATION, OPERATING METHOD OF THE SAME, AND MEMORY SYSTEM INCLUDING THE SAME

(71) Applicant: SAMSUNG ELECTRONICS CO., LTD., Suwon-si (KR)

(72) Inventors: Eun chu Oh, Hwaseong-si (KR); Young-Sik Kim, Suwon-si (KR); Hee-hyun Nam, Seoul (KR); Young-geun Lee, Seoul (KR); Young-jin Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 53 days.

(21) Appl. No.: 16/594,400

(22) Filed: Oct. 7, 2019

(65) Prior Publication Data

US 2020/0159602 A1    May 21, 2020

(30) Foreign Application Priority Data

Nov. 16, 2018    (KR) .................. 10-2018-0141955

(51) Int. Cl.
*G06F 11/07*    (2006.01)
*G06F 11/14*    (2006.01)
(Continued)

(52) U.S. Cl.
CPC ........ *G06F 11/076* (2013.01); *G06F 11/1489* (2013.01); *G06F 11/3466* (2013.01);
(Continued)

(58) Field of Classification Search
CPC ............... G06F 11/076; G06F 11/1489; G06F 11/3466; G06F 13/1668; G06F 2201/88;
(Continued)

(56) References Cited

U.S. PATENT DOCUMENTS 7,663,933 B2    2/2010    Tsukazaki et al.
7,952,928 B2    5/2011    Murin et al.
(Continued)

FOREIGN PATENT DOCUMENTS

JP            5661227 B2        1/2015
KR       10-1692520 B1        1/2017
KR    10-2018-0003713 A     1/2018

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017. (Year: 2017).*

(Continued)

*Primary Examiner* — Cynthia Britt
(74) *Attorney, Agent, or Firm* — Sughrue Mion, PLLC

(57) ABSTRACT

A memory system for performing a recovery operation is provided. A memory system includes a memory device including a plurality of memory cells constituting a plurality of sub-sets, and a memory controller for controlling the memory device. The memory controller controls the memory device to manage a read count indicating a number of read operations performed by the memory device for each of the plurality of sub-sets, and to perform a recovery operation on a sub-set, among the plurality of sub-sets, based on the read count corresponding to the read count. Each of a plurality of sub-sets includes a plurality of pages. Each of the plurality of pages is a unit in which a read operation is performed in the plurality of memory cells.

17 Claims, 11 Drawing Sheets

(51) Int. Cl.
*G06F 11/34* (2006.01)
*G11C 11/409* (2006.01)
*G11C 11/408* (2006.01)
*G06F 13/16* (2006.01)
*G11C 29/52* (2006.01)
*G11C 11/16* (2006.01)
*G11C 13/00* (2006.01)
*G11C 29/04* (2006.01)

(52) U.S. Cl.
CPC ...... *G06F 13/1668* (2013.01); *G11C 11/1673* (2013.01); *G11C 11/409* (2013.01); *G11C 11/4085* (2013.01); *G11C 13/004* (2013.01); *G11C 13/0069* (2013.01); *G11C 29/52* (2013.01); *G06F 2201/88* (2013.01); *G11C 2029/0411* (2013.01)

(58) Field of Classification Search
CPC .... G06F 3/0616; G06F 3/0619; G06F 3/0658; G06F 3/0688; G06F 11/108; G06F 11/1458; G11C 13/0069; G11C 13/004; G11C 11/1673; G11C 29/52; G11C 11/409; G11C 11/4085; G11C 2029/0411; G11C 2213/72; G11C 13/0004; G11C 13/0007; G11C 13/003; G11C 11/5685; G11C 11/5607; G11C 11/5678; G11C 11/1675; G11C 11/1659
See application file for complete search history.

(56) References Cited

U.S. PATENT DOCUMENTS

| | | | |
|---|---|---|---|
| 8,559,224 | B2 | 10/2013 | Han et al. |
| 8,838,883 | B2 | 9/2014 | D'Abreu et al. |
| 9,036,416 | B2 | 5/2015 | Mokhlesi et al. |
| 9,250,991 | B2 | 2/2016 | Frost et al. |
| 9,589,634 | B1 | 3/2017 | Jeyasingh et al. |
| 9,910,606 | B2 * | 3/2018 | Khoueir ............ G06F 11/1012 |
| 10,049,755 | B2 | 8/2018 | Lee et al. |
| 2011/0199825 | A1 * | 8/2011 | Han ............... H01L 27/11582 365/185.11 |
| 2013/0275651 | A1 * | 10/2013 | D'Abreu ........... G11C 16/3431 711/103 |
| 2015/0370701 | A1 * | 12/2015 | Higgins ............ G06F 12/0253 711/103 |
| 2016/0118132 | A1 * | 4/2016 | Prins .................. G11C 16/3431 714/704 |
| 2017/0161135 | A1 * | 6/2017 | Yen ...................... G06F 11/076 |
| 2017/0221570 | A1 * | 8/2017 | Hong ................. G11C 16/3422 |
| 2018/0246794 | A1 * | 8/2018 | Baty ................... G06F 11/3037 |
| 2019/0272881 | A1 * | 9/2019 | Padilla .............. G11C 16/3431 |
| 2020/0110685 | A1 * | 4/2020 | Chew ................ G06F 11/3037 |

OTHER PUBLICATIONS

K. Ha, J. Jeong and J. Kim, "An Integrated Approach for Managing Read Disturbs in High-Density NAND Flash Memory," in IEEE Transactions on Computer-Aided Design of Integrated Circuits and Systems, vol. 35, No. 7, pp. 1079-1091, Jul. 2016. (Year: 2016).*

* cited by examiner

MEMORY CONTROLLER PERFORMING RECOVERY OPERATION, OPERATING METHOD OF THE SAME, AND MEMORY SYSTEM INCLUDING THE SAME

CROSS-REFERENCE TO THE RELATED APPLICATION

This application is based on and claims priority from Korean Patent Application No. 10-2018-0141955, filed on Nov. 16, 2018, in the Korean Intellectual Property Office, the disclosure of which is incorporated herein in its entirety by reference.

BACKGROUND

The disclosure relates to a memory controller and a memory system, and more particularly, to a memory controller that performs a recovery operation, a method of operating the memory controller, and a memory system including the memory controller.

As non-volatile memory devices, resistive memory devices such as phase change RAM (PRAM), resistive RAM (RRAM), and magnetic RAM (MRAM) use a variable resistance element that stores data by a change in resistance state as a memory cell. The commonality of the materials constituting the resistive memory devices is that a resistance value varies according to the magnitude and/or direction of current or voltage, and has a nonvolatile characteristic of maintaining the resistance value even when the current or voltage is shut off.

In this case, the resistance of a resistive memory cell included in the resistive memory device varies depending on the voltage applied to another memory cell. As the resistance varies, the reliability of data may not be ensured or the memory cell itself may be deteriorated.

SUMMARY

The disclosure provides a memory controller that manages the number of read operations for a memory cell in units of subsets, thereby maintaining the distribution of resistance of the memory cell.

According to an aspect of the disclosure, there is provided a memory system comprising: a memory device comprising a plurality of memory cells constituting a plurality of sub-sets; and a memory controller configured to: manage a read count indicating a number of read operations performed by the memory device in each of the plurality of sub-sets, and perform a recovery operation on a sub-set, among the plurality of sub-sets, based on the read count corresponding to the sub-set, wherein each of the plurality of sub-sets comprises a plurality of pages, and wherein each of the plurality of pages is a unit in which a read operation is performed in the plurality of memory cells.

According to another aspect of the disclosure, there is provided a method of operating a memory controller for controlling an operation of a memory device comprising a plurality of memory cells constituting a plurality of sub-sets, the method comprising: transmitting a read command to the memory device; increasing a read count for a sub-set, among the plurality of sub-sets, corresponding to the read command; and performing a recovery operation on the sub-set based on the read count corresponding to the sub-set, wherein the sub-set comprises a plurality of pages, and wherein each of the plurality of pages is a unit in which a read operation is performed in the plurality of memory cells.

According to another aspect of the disclosure, there is provided a memory controller for controlling a memory device comprising a plurality of memory cells constituting a plurality of sub-sets, the memory controller comprising: a memory configured to store one or more instruction; and at least one processor configured to execute the one or more instructions to manage a read count, which indicates a number of read commands transmitted to the memory device for each of the plurality of sub-sets, determine whether the read count reaches a first reference value for a sub-set, among the plurality of sub-sets, and output an instruction to perform a recovery operation for the sub-set corresponding to the read count based on a result of the determination that the read count reaches the first reference value, wherein each of the plurality of sub-sets comprises a plurality of pages, and wherein each of the plurality of pages is a unit in which a read operation is performed in the plurality of memory cells.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Hereinafter, embodiments of the disclosure will be described in detail with reference to the accompanying drawings.

Figure 1:
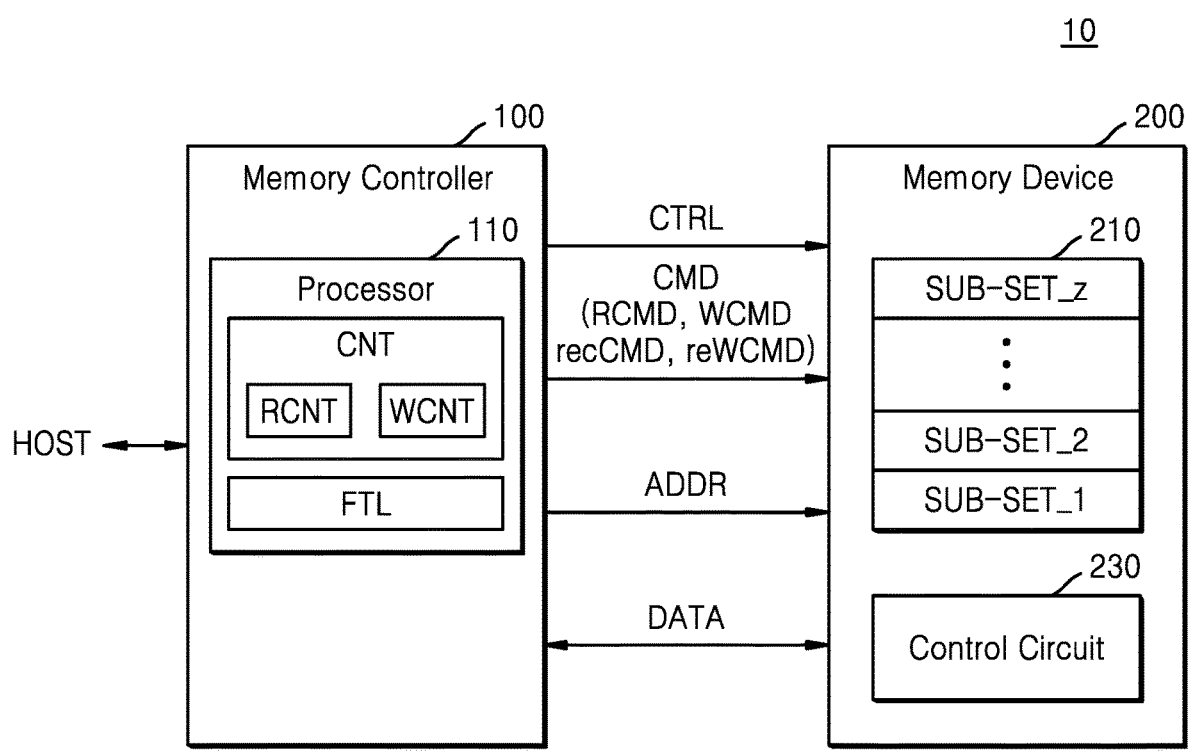
FIG. 1 is a block diagram illustrating a memory system according to an example embodiment of the disclosure.

FIG. 1 is a block diagram illustrating a memory system 10 according to an example embodiment of the disclosure.

Referring to FIG. 1, the memory system 10 may include a memory controller 100 and a memory device 200.

The memory controller 100 may control the memory device 200 to write data to the memory device 200 or to read data stored in the memory device 200 in response to a write/read request from a host HOST. For example, the memory controller 100 may provide an address ADDR, a command CMD (e.g., a read command RCMD, a write command WCMD, a recovery command recCMD, and a rewrite command reWCMD), and a control signal CTRL to memory device 200, thereby controlling to provide program (or write) and read operations with respect to the memory device 200. In addition, data DATA to be written and read data DATA may be transmitted and received between the memory controller 100 and the memory device 200. In FIG. 1, although the rewrite command reWCMD is illustrated as a command different from the write command WCMD, the disclosure is not limited thereto, and the rewrite command reWCMD may be included, not as a separate command, in the write command WCMD.

The memory controller 100 may receive a request based on a logical address from the host HOST. A flash translation layer FTL driven by a processor 110 of the memory controller 100 may convert a logical address to a physical address of the memory device 200. The memory controller 100 may transfer the converted physical address to the memory device 200.

The memory controller 100 may count read operations performed in the memory device 200. For example, the memory controller 100 may count the number of read commands RCMD transmitted to the memory device 200. In an embodiment, the memory controller 100 may manage a read count RCNT for each of sub-sets SUB-SET_1 to SUB-SET_z. That is, the memory controller 100 may manage the read count RCNT in units of sub-sets.

The memory controller 100 may count the write operations performed in the memory device 200. That is, the memory controller 100 may count the number of write commands WCMD transmitted to the memory device 200. In an embodiment, the memory controller 100 may manage a write count WCNT for each of the sub-sets SUB-SET_1 to SUB-SET_z. That is, the memory controller 100 may manage the write count WCNT based on a sub-set unit.

However, the disclosure is not limited thereto, and the memory controller 100 may not manage the write count WCNT based on a sub-set unit. According to another embodiment, the memory controller 100 may not manage the read count RCNT based on a sub-set unit. According to yet another embodiment, the units used for managing the read count RCNT and the write count WCNT in the memory controller 100 may be different from each other.

The memory controller 100 may determine whether a recovery operation for each of the sub-sets SUB-SET_1 to SUB-SET_z is performed based on the read count RCNT. In this case, a recovery operation may mean an operation for reducing an error in a read operation for the sub-sets SUB-SET_1 to SUB-SET_z by preventing degradation of resistance distribution corresponding to the data stored in the sub-sets SUB-SET_1 to SUB-SET_z.

In an embodiment, the memory controller 100 may transmit a recovery command recCMD to the memory device 200 when a recovery operation is required for at least one sub-set of the sub-sets SUB-SET_1 to SUB-SET_z. A control circuit 230 of the memory device 200, in response to the recovery command recCMD, may provide a recovery voltage to a sub-set corresponding to the recovery command recCMD.

In an embodiment, the memory controller 100 may transmit a rewrite command reWCMD to the memory device 200 when a recovery operation is required for at least one sub-set among the sub-sets SUB-SET_1 to SUB-SET_z. The memory device 200 may perform a rewrite operation on a sub-set requiring the recovery operation in response to the rewrite command reWCMD. That is, the memory device 200 may rewrite the data DATA written in the sub-set requiring the recovery operation.

The memory controller 100 may perform a wear leveling operation for each of the sub-sets SUB-SET_1 to SUB-SET_z based on the write count WCNT. As data is written to the same memory cell through the wear leveling operation, degradation of a memory cell may be prevented.

Memory controller 100 may include a counter CNT driven by the processor 110. The counter CNT may increase a read count RCNT for a sub-set including specific memory cells when a read operation is performed on the specific memory cells. In addition, the counter CNT may increase a write count WCNT for a sub-set including specific memory cells when a write operation is performed on the specific memory cells.

The memory device 200 may include a memory cell array 210 and a control circuit 230. The memory cell array 210 may include a plurality of memory cells (e.g., MCs in FIG. 5) each placed in regions where a plurality of first signal lines and a plurality of second signal lines intersect each other. That is, the memory cell array 210 may be a memory cell array having a cross-point structure. In an embodiment, the first signal lines may be a plurality of word lines, and the second signal lines may be a plurality of bit lines. In another embodiment, the first signal lines may be a plurality of bit lines, and the second signal lines may be a plurality of word lines.

In an embodiment, the plurality of memory cells may include resistive memory cells including a variable resistance element. For example, when the variable resistance element includes a phase change material, e.g., Ge—Sb—Te (GST), and resistance of the variable resistance element varies based on temperature, the memory device 200 may be a PRAM. Alternatively, for example, the memory device 200 may be an RRAM when the variable resistance element includes an upper electrode, a lower electrode, and a complex metal oxide therebetween. Alternatively, for example, the memory device 200 may be an MRAM when the variable resistive element includes an upper electrode of a magnetic body, a lower electrode of the magnetic body, and a dielectric therebetween. Accordingly, the memory device 200 may be referred to as a resistive memory device, and the memory system 10 may be referred to as a resistive memory system.

In an embodiment, each of the memory cells may be a single level cell (SLC) storing one-bit data. In this case, the memory cells may have two different resistance distributions depending on the stored data. In another embodiment, each of the plurality of memory cells may be a multi-level cell (MLC) capable of storing two-bit data. In this case, the memory cells may have four resistance distributions depending on the stored data. In yet another embodiment, each of the plurality of memory cells may be a triple level cell (TLC) capable of storing three-bit data. In this case, the memory cells may have eight resistance distributions depending on the stored data. However, the disclosure is not limited thereto. In an embodiment, the memory cell array 210 may include memory cells each capable of storing data of 4 bits or more, and the memory cell array 210 may include a single level cell, a multi-level cell, and/or a triple-level cell.

The memory cell array 210 may include sub-sets SUB-SET_1 to SUB-SET_z. Each sub-set may be a unit in which the memory controller 100 manages a read count RCNT, and may include a plurality of pages as a unit in which a read/write operation is performed. In addition, each sub-set may include memory cells connected to one word line in each of different memory bays (e.g., BAY in FIG. 4).

The control circuit 230 may control operations of the memory device 200. In an embodiment, the control circuit 230 may control voltage levels of voltages applied to the first and second signal lines connected to the memory cell array 210 or timing at which the voltages are applied, in response to the command CMD received from the memory controller 100. In an embodiment, the control circuit 230 may perform a recovery operation on at least one of the sub-sets SUB-SET_1 to SUB-SET_z in response to the command CMD received from the memory controller 100. The memory device 200 according to the embodiment may perform a recovery operation, thereby preventing deterioration of resistance distribution of memory cells included in the sub-sets SUB-SET_1 to SUB-SET_z.

Figure 2:
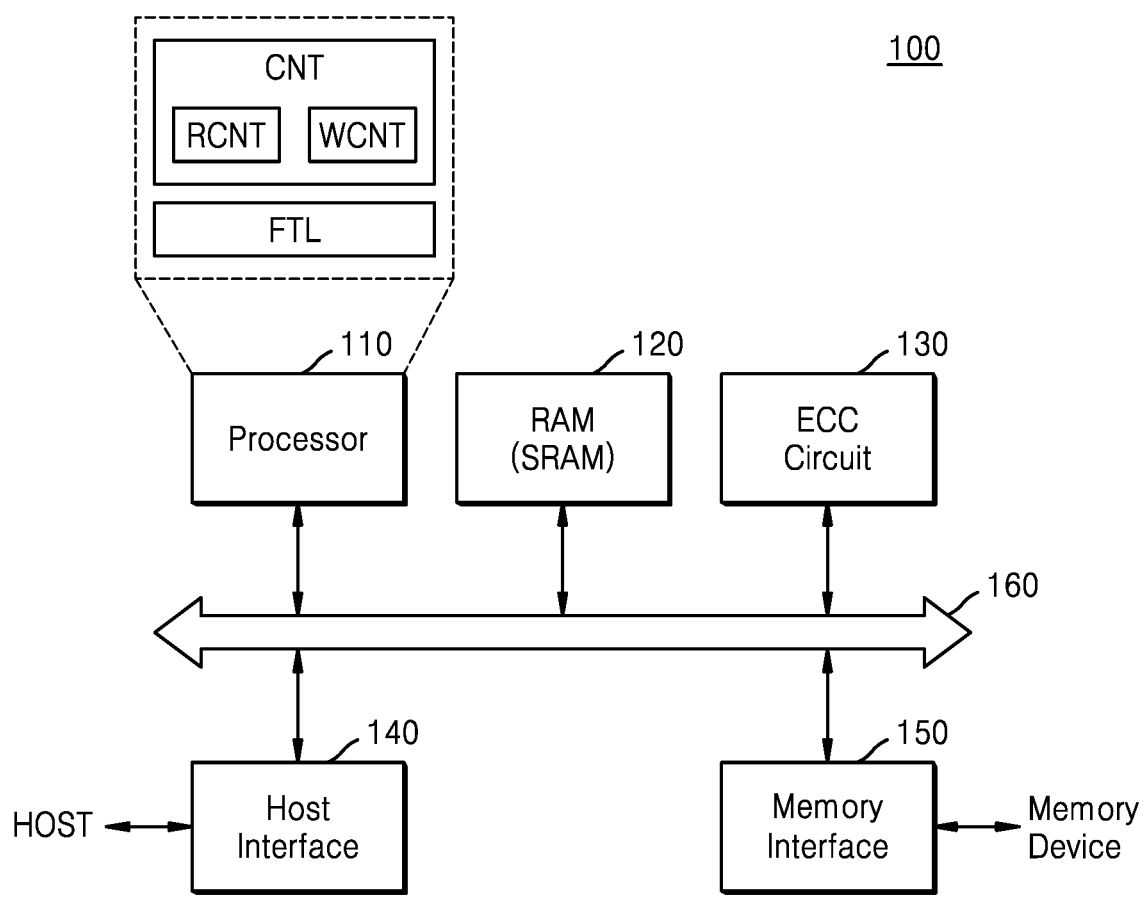
FIG. 2 is a block diagram illustrating a memory controller included in the memory system of FIG. 1.

FIG. 2 is a block diagram illustrating in detail the memory controller 100 included in the memory system 10 of FIG. 1.

Referring to FIG. 2, the memory controller 100 may include a processor 110, a random access memory (RAM) 120, an error correction code (ECC) circuit 130, a host interface 140, a memory interface 150, and a bus 160.

The processor 110 may include a central processing unit or a microprocessor, and the like, and may control an overall operation of the memory controller 100. The processor 110 may communicate with a host HOST through the host interface 140 and may communicate with a memory device 200 through the memory interface 150. The processor 110 may use the RAM 120 as an operation memory, cache memory, or buffer memory to control the memory device 200.

In an embodiment, at least one of a flash translation layer FTL and a counter CNT may be implemented in the form of software such as firmware, an operating system, and an application. In an embodiment, at least one of the flash translation layer FTL and the counter CNT may be implemented in hardware such as circuitry, or intellectual property (IP) in the processor 110. In an embodiment, at least one of the flash translation layer FTL and the counter CNT may be implemented in the form of a combination of hardware and software in association with the processor 110. In an embodiment, at least one of the flash translation layer FTL and the counter CNT may be provided as a separate module separated from the processor 110.

The memory controller 100 embedded according to the disclosure may manage a read count RCNT which is the number of times the read command is transmitted using the counter CNT and may determine whether the recovery operation is performed based on the read count RCNT. Thus, the memory controller 100 may prevent the degradation of resistance distribution of memory cells included in the memory device 200 through the recovery operation. In an embodiment, the units used for managing the read count RCNT and the write count WCNT in the memory controller 100 may be same as sub-set unit, respectively.

The RAM 120 may be used as an operating memory, a cache memory, or a buffer memory of the processor 110. The RAM 120 may store codes and instructions that the processor 110 executes. The RAM 120 may store data processed by the processor 110. The RAM 120 may include an SRAM (Static RAM). In an embodiment, the processor 110 may be configured to drive firmware to control the memory controller 100, and the firmware may be loaded into the RAM 120 to be driven.

The ECC circuit 130 may perform ECC encoding based on data to be written to the memory device 200 through a memory interface 150. The ECC encoded data may be transferred to the memory device 200 through the memory interface 150. The ECC circuit 130 may perform ECC decoding for data received from the memory device 200 through the memory interface 150.

The host interface 140 may interface with the host HOST to receive a request for a memory operation from the host HOST. For example, the host interface 140 receives various requests, such as reading and writing data from the host HOST, and in response, generates various internal signals for memory operations to the memory device 200.

The memory interface 150 may provide an interface between the memory controller 100 and the memory device 200, for example, write data and read data may be transmitted to and received from the memory device 200 via the memory interface 150. In addition, the memory interface 150 may provide a command and an address to the memory device 200. In addition, the memory interface 150 may receive various pieces of information from the memory device 200 to provide the received information to the memory controller 100.

The bus 160 may be configured to provide a channel between components of the memory controller 100. In an embodiment, the bus 160 of the memory controller 100 may be divided into a control bus and a data bus. The data bus may transmit data within the memory controller 100 and the control bus may be configured to transmit control information such as commands, addresses, within the memory controller 100. The data bus and the control bus may be separated from each other to interfere with each other or not to affect with each other.

Figure 3:
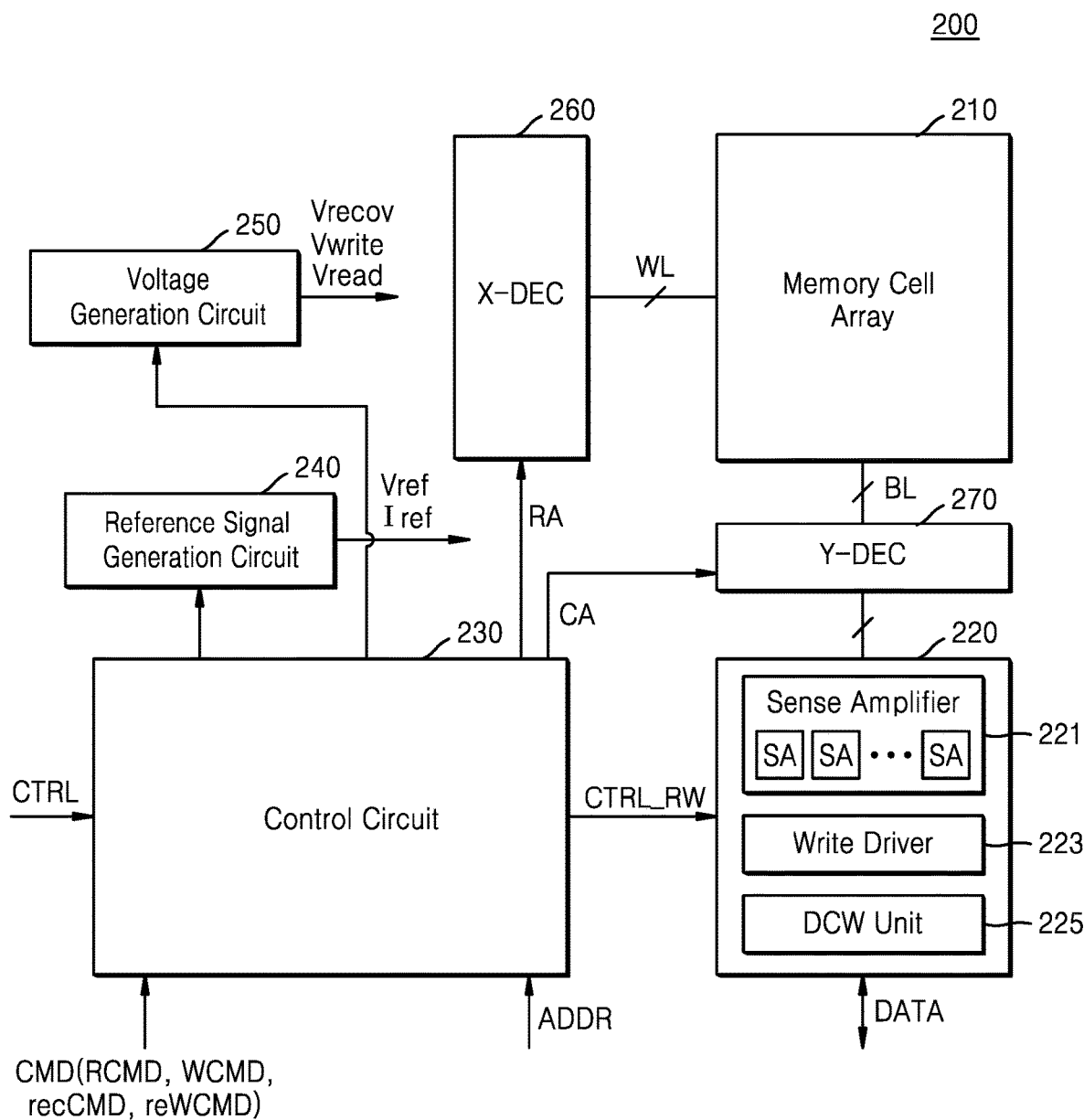
FIG. 3 is a block diagram illustrating a memory device included in the memory system of FIG. 1.

FIG. 3 is a block diagram illustrating memory device 200 included in memory system 10 of FIG. 1.

Referring to FIG. 3, the memory device 200 may include a memory cell array 210, a write/read circuit 220, a control circuit 230, a reference signal generation circuit 240, a voltage generation circuit 250, a row decoder 260 and a column decoder 270.

The memory cell array 210 may include a plurality of memory cells, and the plurality of memory cells may be connected to a plurality of first signal lines and a plurality of second signal lines. In an embodiment, the plurality of first signal lines may be word lines WL, and the plurality of second signal lines may be bit lines BL. As various voltage signals or current signals are provided through the plurality of word lines WL and bit lines BL, data may be written to or read from the selected memory cells, and write operations or read operations may be prevented from being performed for the remaining unselected memory cells. An example description of memory cells constituting the memory cell array 210 will be described later with reference to FIG. 4.

An address ADDR for indicating a memory cell to be accessed in accordance with the command CMD may be received in the memory device 200, and the address ADDR may include a row address RA for selecting the word lines WL of the memory cell array 210 and a column address CA for selecting the bit lines BL of the memory cell array 210. The row decoder 260 performs a word line select operation in response to a row address RA and the column decoder 270 may perform a bit line select operation in response to a column address CA.

The write/read circuit 220 may be connected to first signal lines and/or second signal lines of the memory cell array 210 to write data to the memory cell or to read data from the memory cell. The write/read circuit 220 may include a sense amplifier 221, a write driver 223, and a data compare-write unit 225. In FIG. 3, although the write/read circuit 220 may include the data compare-write unit 225, the data compare-write unit 225 is not limited thereto, and the data compare-write unit 225 may have a configuration separated from the write/read circuit 220 and may be configured to control an operation of the write/read circuit 220.

A sense amplifier 221 may be coupled to a memory cell array 210 via bit lines BL. In a read operation, the sense amplifier 221 may receive a data voltage through bit lines BL to amplify the received data voltage. To this end, the sense amplifier 221 may be implemented to include a plurality of sensing amplifier circuits SA for sensing and amplifying the data voltage. For example, each of the sensing amplifier circuits SA may be implemented to compare a data voltage and a reference voltage, and to output the compared result as a digital level data signal. One sensing amplifier circuit SA may be connected to one memory bay (e.g., BAY in FIG. 4) constituting the memory cell array 210.

The data compare-write unit 225 may be connected to the sense amplifier 221 and a write driver 223. The data compare-write unit 225 may receive data DATA from a memory controller 100 (e.g., 100 in FIG. 1). The data compare-write unit 225 may control the sense amplifier 221 and the write driver 223 to perform a compare-write operation or a rewrite operation in response to a control signal CTRL_RW of the control circuit 230.

For example, the data compare-write unit 225 may control the write driver 223 to maintain data stored in the memory cell when a compare-write unit is performed, when data requested to be written and the data stored in the memory cell are the same. When the data requested to be written and the data stored in the memory cell are not the same, the data compare-write unit 225 may control the write driver 223 to allow the write-requested data to be overwritten in the memory cell.

In addition, for example, when a rewrite operation is performed, the data compare-write unit 225 may control the sense amplifier 221 and the write driver 223 to perform a rewrite operation to write the write requested data to the memory cell regardless of the data stored in the memory cell. That is, unlike the compare-write operation, when the rewrite operation is performed, the data compare-write unit 225 may control the sense amplifier 221 so as not to perform a pre-read operation, and may control the write driver 223 to allow the write requested data to be overwritten to the corresponding memory cell. For example, even though the written data and the newly requested data are the same, the newly requested data may be overwritten in the memory cell. For example, a write pulse may be applied to at least one of memory cells, in a page in which a write operation is performed, in which the written data and the newly requested data are the same. For example, a write pulse for a write operation may be applied to all memory cells in a page where a write operation is performed.

The voltage generation circuit 250 may generate a write voltage Vwrite used for the write operation and may generate a read voltage Vread used for the read operation. In addition, the voltage generation circuit 250 may generate a recovery voltage Vrecov used for the recovery operation. The write voltage Vwrite may include a set pulse, a reset pulse, and the like as various voltages related to the write operation. The recovery voltage Vrecov may be a voltage related to the recovery operation and may include a recovery pulse. The recovery pulses may have different voltage levels from the set pulse and the reset pulse, or the durations of the recovery pulses may be different from the set pulse and the reset pulse. The write voltage Vwrite, the read voltage Vread and the recovery voltage Vrecov may be supplied to the bit lines BL through the column decoder 270 or may be supplied to the word lines WL through the row decoder 260.

The reference signal generation circuit 240 may generate a reference voltage Vref and a reference current Iref as various reference signals related to the data read operation. For example, the sense amplifier 221 may be connected to a node (e.g., a sensing node) of the bit lines BL to determine data, and may determine a data value through a comparison operation with respect to a voltage of the sensing node and the reference voltage Vref. Alternatively, when a current sensing method is applied, a reference signal generation circuit 240 may generate a reference current Iref to provide the reference current Iref to the memory cell array 210, and may determine the data value by comparing a voltage of the sensing node caused by the reference current Iref with the reference voltage Vref.

The write/read circuit 220 may provide a determination result of the read data to the control circuit 230. The control circuit 230 may control the write and read operations of the memory cell array 210 with reference to the determination result.

The control circuit 230 may output various control signals CTRL_RW to write data to the memory cell array 210 or to read data from the memory cell array 210 based on a command CMD, an address ADDR and a control signal CTRL which are received from the memory controller 100. The control circuit 230 may perform a recovery operation based on the command CMD, the address ADDR, and the control signal CTRL received from the memory controller 100. For example, the control circuit 230 may control a voltage generation circuit 250, a column decoder 270, and a row decoder 260 to provide a recovery voltage Vrecov to a sub-set (e.g., at least one of a sub-sets SUB-SET_1 to SUB-SET_z in FIG. 1) corresponding to a recovery command recCMD. For example, the control circuit 230 may control the voltage generating circuit 250, the column decoder 270 and the row decoder 260 to rewrite data in the sub-set corresponding to a rewrite command reWCMD (e.g., at least one of a sub-sets SUB-SET_1 to SUB-SET_z in FIG. 1).

Figure 4:
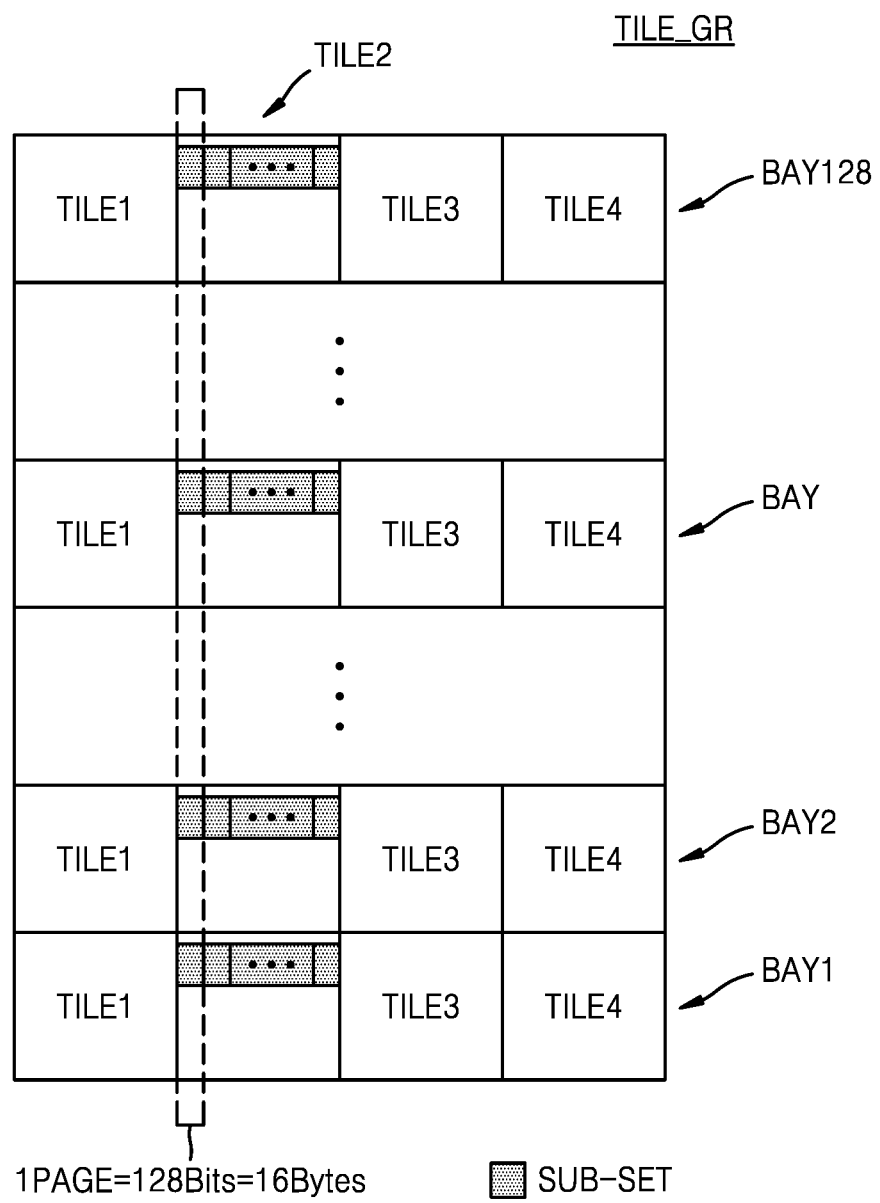
FIG. 4 is a block diagram illustrating an implementation example of a memory cell array of FIG. 3.

FIG. 4 is a block diagram showing an implementation example of the memory cell array 110 of FIG. 3. The memory cell array 210 of FIG. 3 may be implemented to include a memory tile group TILE_GR in which memory tiles TILE1 to TILE4 are arranged along a row direction and a column direction in a plan view. In this case, the memory tile group TILE_GR may include a plurality of memory bays BAY1 to BAY128, and memory tiles TILE1 to TILE4 may be arranged in each memory bay BAY. The memory bay BAY may include memory cells connected to one of the plurality of sensing amplifier circuits included in the sense amplifier 221 of FIG. 3.

FIG. 4 shows 128 memory bays BAY1 to BAY128 in which four memory tiles TILE1 to TILE4 constitute one memory bay BAY. The disclosure is not limited thereto, and the number of memory bays BAY1 to BAY128 and the number of memory tiles TILE1 to TILE4 may be variously configured according to embodiments.

Referring to FIG. 4, the memory tile group TILE_GR may be set as a memory area in which data in a unit of a page PAGE is written or read. One page PAGE may be a set of selected memory cells that simultaneously perform write and read operations among the memory cells. The page PAGE may include memory cells included in each of different memory bays BAY1 to BAY128 of the memory tile group TILE_GR. For example, when assuming that data bits corresponding to one page unit are 128 bits (or 16 bytes), in each of the 128 memory bays BAY1 to BAY128 included in the memory tile group TILE_GR, one bit data may be written or read.

One sub-set SUB-SET may include memory cells included in each of different memory bays BAY1 to BAY128 of the memory tile group TILE_GR. In an embodiment, one sub-set SUB-SET may include a plurality of pages PAGE. Thus, it may be easier for a memory controller 100 to manage a read count of the sub-set SUB-SET.

In an embodiment, memory cells connected to one word line in each of the different memory bays BAY1 to BAY128 may be included in one sub-set SUB-SET. In an embodiment, memory cells, correspond to a same word line address in each of the plurality of memory bays BAY1 to BAY128 are included in a same sub-set SUB-SET. In an embodiment, memory cells correspond to a same word line address in each of the plurality of memory tiles TILE-TILE4 are included in a same sub-set. Memory cells constituting a sub-set in one tile will be described later with reference to FIGS. 5 and 7.

Figure 5:
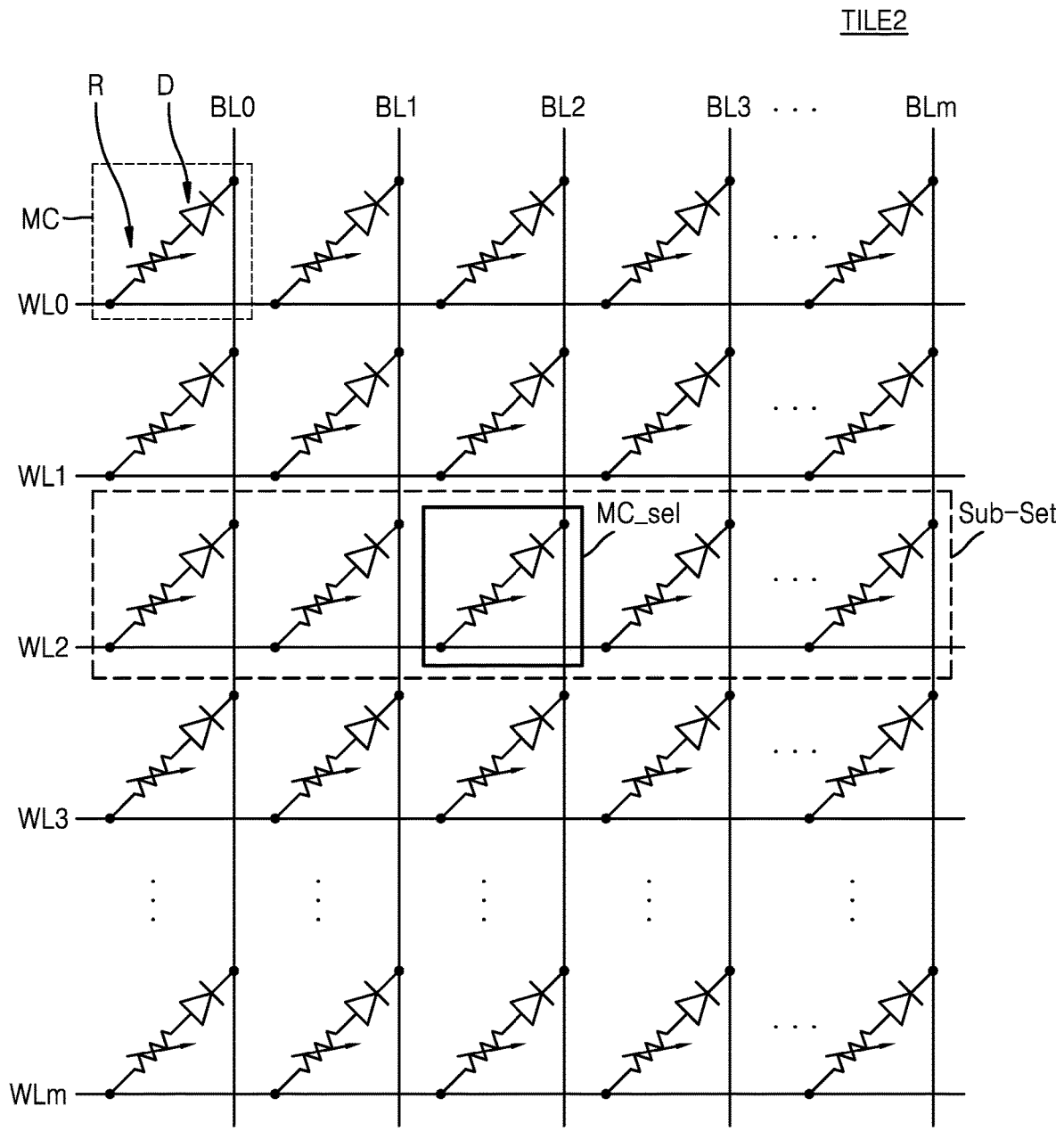
FIG. 5 is a circuit diagram illustrating an example embodiment of one memory tile of FIG. 4.

FIG. 5 is a circuit diagram showing an example embodiment of one memory tile TILE2 of FIG. 4.

Referring to FIG. 5, the memory tile TILE2 may include a plurality of word lines WL0 to WLm, a plurality of bit lines BL0 to BLm, and a plurality of memory cells MC. Here, the number of the word lines WL, the number of the bit lines BL, and the number of the memory cells MC may be variously changed according to embodiments.

According to an embodiment, each of the plurality of memory cells MC may include a variable resistive element R and a selection element D. Here, the variable resistance element R may be referred to as a variable resistance element or a variable resistance material, and the selection element D may be referred to as a switching element. However, unlike the one illustrated in FIG. 5, each of the plurality of memory cells MC may include only the variable resistance element R, may include the variable resistance element R and a bi-directional diode, or may include the variable resistance element R and a transistor.

In an embodiment, the variable resistance element R may be connected between one of the plurality of word lines WL0 to WLm and the selection element D, and the selection element D may be connected between the variable resistance element R and a one of the plurality of bit lines BL0 to BLm. However, the disclosure is not limited thereto, and the selection element D may be connected between one of the plurality of word lines WL0 to WLm and the variable resistance element R, and the variable resistance element R may be connected between the selection element D and one of the plurality of bit lines BL0 to BLm.

The selection element D may be connected between any one of the plurality of bit lines BL0 to BLm and the variable resistive element R, and the supply of current to the variable resistive element R may be controlled according to a voltage applied to the connected word line and bit line. In an embodiment, the selection element D may be a PN junction or a PIN junction diode, and an anode of the diode may be connected to the variable resistance element R and a cathode of the diode may be connected to a plurality of bit lines BL0 to BLm. In this case, when a voltage difference between the anode and the cathode of the diode is greater than a threshold voltage of the diode, the diode may be turned on and current may be supplied to the variable resistive element R.

Figure 6:
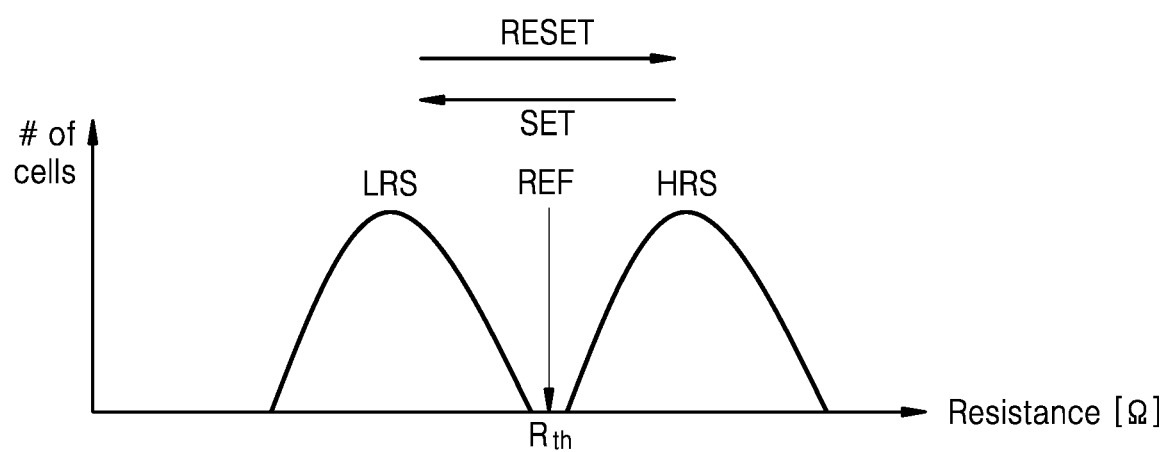
FIG. 6 is a graph for explaining example characteristics of a memory cell of FIG. 5.

FIG. 6 is a diagram explaining example characteristics of the memory cell MC of FIG. 5. FIG. 6 shows an ideal distribution of a single level cell in which a memory cell MC is programmed with one bit. In FIG. 6, a horizontal axis represents the resistance, and a vertical axis indicates the number of memory cells.

Referring to FIGS. 5 and 6, the variable resistive element R of the memory cell MC may have a low resistance state LRS or a high resistance state HRS. An operation of switching the variable resistive element R from the high resistance state HRS to the low resistance state LRS by applying a set pulse to the memory cell MC is referred to as a set operation or a set write operation. In addition, the operation of switching the variable resistive element R from the low resistance state LRS to the high resistance state HRS by applying a reset pulse to the memory cell is referred to as a reset operation or a reset write operation.

An arbitrary resistance between the distribution due to the low resistance state LRS and the distribution due to the high resistance state HRS may be set to a threshold resistance Rth. In a read operation for a memory cell MC, a read result of the read operation may be determined to be a reset data (logic "0") as the high resistance state HRS when the read result is equal to greater than the threshold resistance Rth, and a read result of the read operation may be determined to be a set data (logic "1") as the low resistance state LRS when the read result is equal to or less than the threshold resistance Rth.

When assuming that data is read out from one selected memory cell MC_sel of the memory tile TILE2, a third bit line BL2 and a third word line WL2 connected to the selected memory cell MC_sel may be supplied with each selection voltage, and a non-selection voltage may be applied to the other bit lines BL0 to BL1, BL3 to BLm and the other word lines WL0 to WL1 and WL3 to WLm.

Unselected memory cells connected to a third word line WL2 that connect to the selected memory cell MC_sel may change a resistance value by a selection voltage applied to the third word line WL2, and thus read disturbance in which resistance distribution is widened may occur. The read disturbance may mean stressing the unselected memory cells rather than selected memory cells to perform a read operation. For example, the resistance values of the unselected memory cells may increase due to the read disturbance, and the resistance distribution may be widened. Thus, as the number of read operations in other memory cells connected to the same word line connected to a specific memory cell is increased, the resistance distribution of the specific memory cell may deteriorate. Since the memory cells reduce sensing margin between set data of logic "1" and reset data of logic "0", it may cause a problem in which the memory cells are fixed in a reset state.

Referring to FIGS. 4 and 5 again, FIG. 5 illustrates memory cells included in one memory tile of the memory cells constituting a sub-set. The memory cells MC connected to the same word line among the memory cells MC included in one memory tile TILE2 may be included in the same sub-set. In an embodiment, memory cells connected to different word lines may be included in different sub-sets. For example, the memory cells MC connected to a first word line WL0 may be included in one sub-set SUB-SET and the memory cells MC connected to a second word line WL1 may be included in another sub-set SUB-SET and the memory cells MC connected to a (m+1)th word line WLm may be included in another sub-set SUB-SET.

The memory controller 100 and the memory device 200 according to the disclosure may manage a read count for each sub-set unit and may perform a recovery operation for each sub-set unit.

Since the sub-set SUB-SET includes memory cells connected to the same word line, the read count may be also increased with respect to the unselected memory cells when a read operation on a part of selected memory cells included in a sub-set including the unselected memory cells is performed. Accordingly, even though there are unselected memory cells due to the repetition of the read operation, it may be possible to prevent read disturbance from occurring in the unselected cells by being connected to the same word line (e.g., a third word line WL2) as the selected memory cell (e.g., MC_sel). That is, in spite of being unselected memory cells, it may be possible to prevent degradation of resistance distribution by applying the selection voltage to the connected word line.

Figure 7:
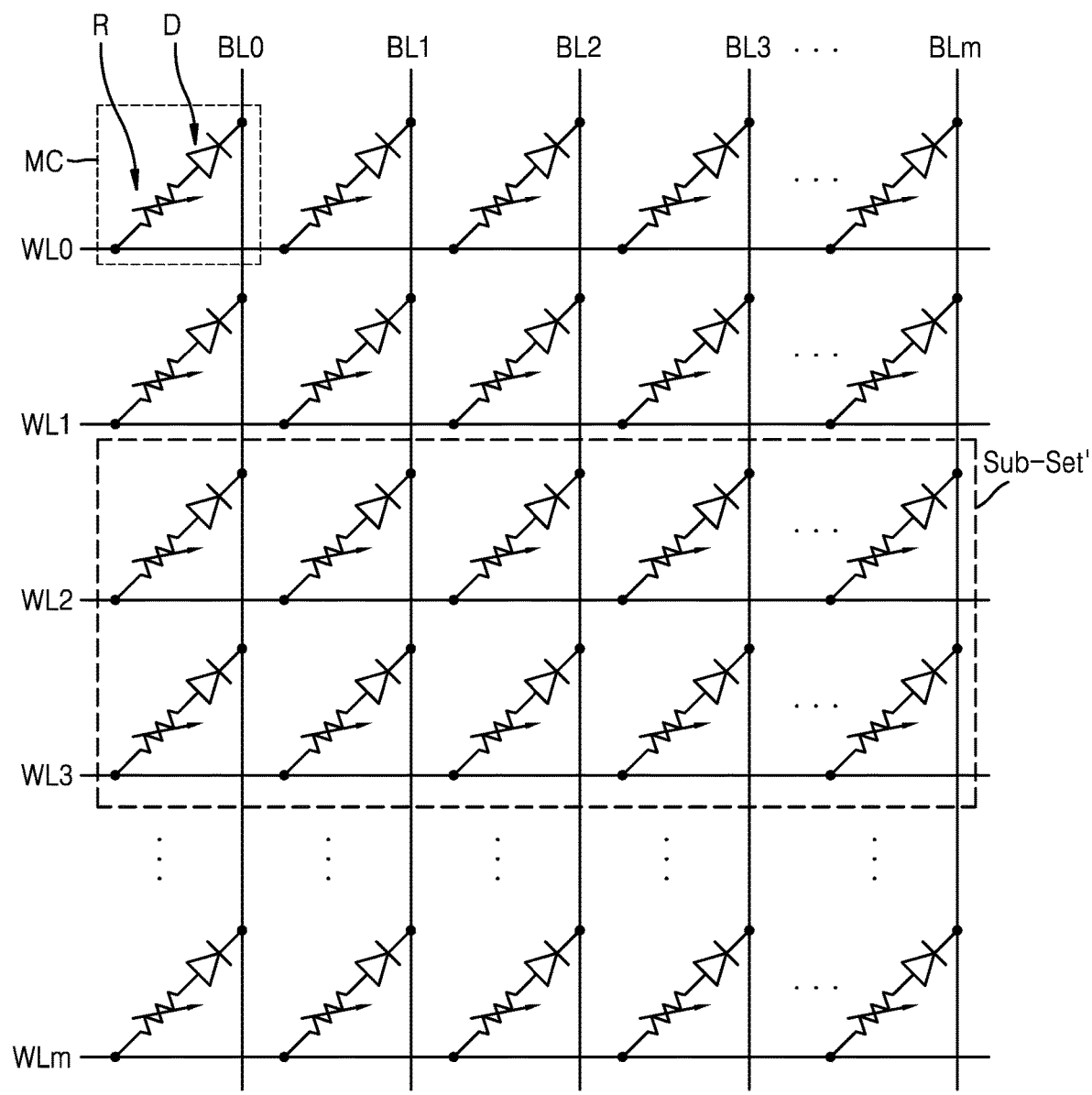
FIG. 7 is a circuit diagram illustrating an example embodiment of one memory tile of FIG. 4.

FIG. 7 is a circuit diagram showing an example embodiment of one memory tile TILE2 in FIG. 4. FIG. 7 is a diagram illustrating memory cells included in one tile of the memory cells constituting a sub-set Sub-Set'.

Referring to FIG. 7, among memory cells MC included in one memory tile TILE2, memory cells MC connected to the same word line may be included in the same sub-set Sub-Set'. In an embodiment, memory cells MC connected to some word lines of the plurality of word lines WL0 to WLm may be included in the same sub-set Sub-Set'. For example, the memory cells MC connected to two of the word lines WL0 to WLm connected to one memory tile TILE2 may be included in the same sub-set Sub-Set'. The memory cells MC connected to the first word line WL0 and the second word line WL1 may be included in one sub-set Sub-Set' and the memory cells MC connected to the third word line WL2 and the fourth word line WL3 may be included in another sub-set Sub-Set'. The memory cells MC connected to the m-th word line WLm−1 and the (m+1)-th word line WLm may be included in another sub-set Sub-Set'. In FIG. 7, the memory cells included in each sub-set in the memory tile TILE2 are shown connected to two word lines, but the disclosure is not limited thereto and may be connected to three or more word lines.

Since a memory controller 100 and a memory device 200 according to the disclosure manage the read count and perform a recovery operation based on a sub-set Sub-Set' unit, it may be possible to prevent deterioration of the memory cell due to the repeated execution of the read operation. Since a sub-set Sub-Set' includes all of the memory cells connected to the same word line, the read count may also be increased with respect to unselected memory cells included in the sub-set Sub-Set' when a read operation is performed with respect to some of the selected memory cells (e.g., memory cells constituting one page) included in the sub-set Sub-Set'. Thus, since the selected voltage is applied to the connected word line even though the memory cells are not selected, it may be possible to prevent the resistance distribution from being deteriorated.

Figure 8:
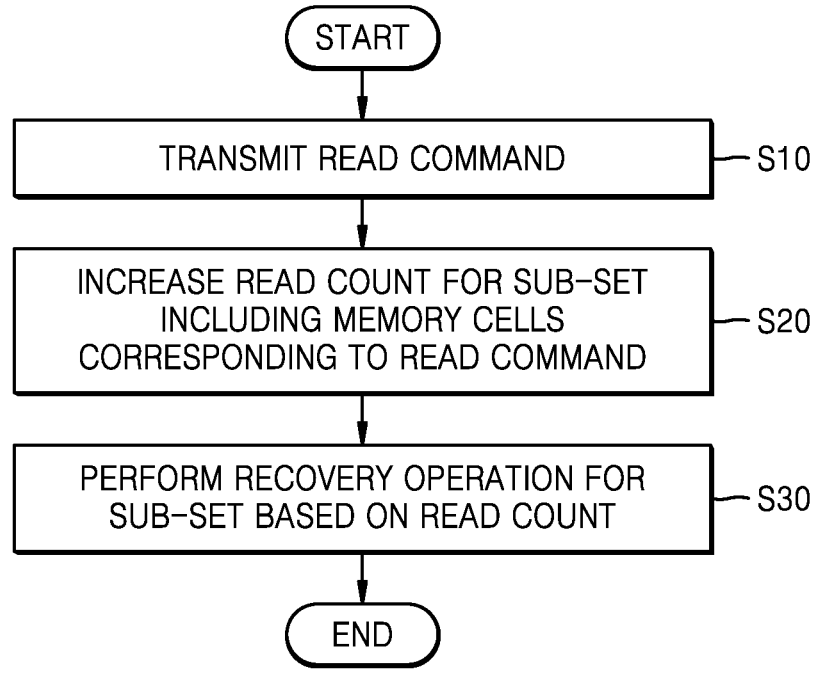
FIG. 8 is a flowchart for explaining a method of operating a memory controller according to an example embodiment of the disclosure.

FIG. 8 is a flow chart for explaining a method of operating a memory controller 100 according to an example embodiment of the disclosure.

Referring to FIGS. 1 and 8, the memory controller 100 may receive a read request and a logical address from an external host HOST, and the memory controller 100 may perform a read operation. For example, the flash translation layer (FTL) may convert a logical address to a physical address of the memory device 200. In operation S10, the memory controller 100 may transmit a read command to the memory device 200.

In step S20, the memory controller 100 may increase the read count for a sub-set that includes memory cells (e.g., memory cells that constitute one page) corresponding to the transmitted read command. For example, a corresponding sub-set may be detected based on a physical address corresponding to the read command, and the read count of the detected sub-set may be increased.

In an embodiment, when a read command is transmitted, the memory controller 100 may increase the read count for the sub-set corresponding to the read command by a constant value. In an embodiment, when a read command is transmitted, the memory controller 100 may increase the read count to have a read weight according to the physical address ADDR of the sub-set corresponding to the read command. For example, the degree of occurrence of the read disturbance may vary depending on the arrangement of the word lines to be connected among the memory cells, and the read weight may be calculated reflecting the read disturbance, and the read count may be increased by the read weight.

In step S30, the memory controller 100 may perform a recovery operation for the sub-set based on the read count. For example, when the read count exceeds a specific value, a recovery operation for the sub-set corresponding to the exceeded read count may be performed. The step S30 will be described later with reference to FIG. 9 and the like.

Every time a read operation is performed on a page, a read disturbance may occur in a sub-set containing the page. When the read disturbance is accumulated, data stored in the unselected memory cells may be changed, and thus the reliability of the data may be difficult to be guaranteed. The recovery operation may include applying a recovery pulse to the memory cells to return the changed resistance distribution back to an original state, and reading the valid data from the memory cells and rewriting the read data. When the recovery operation is performed, since the influence of the read disturbance is removed, the reliability of the data may be restored.

The memory controller 100 according to the disclosure may perform a recovery operation for a sub-set based on a read count managed by a counter CNT. Thus, the reliability of the data written in the memory device 200 by the recovery operation may be guaranteed.

Figure 9:
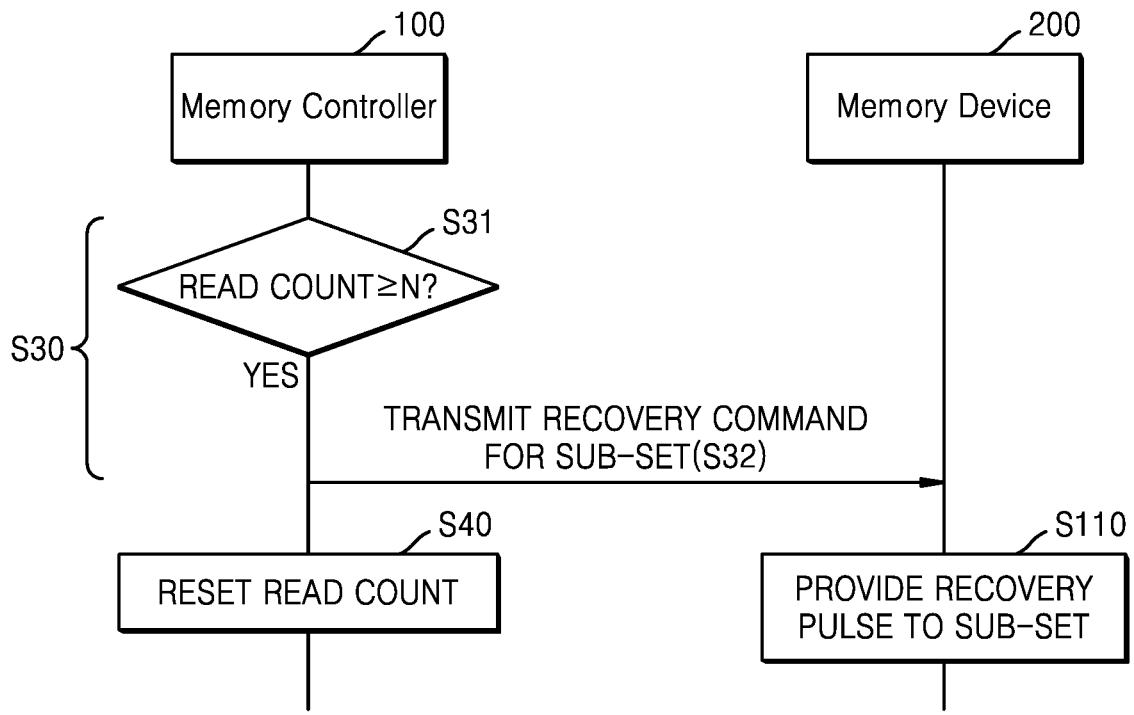
FIG. 9 is a flowchart for explaining a method of operating a memory system according to an example embodiment of the disclosure.

FIG. 9 is a flow chart for explaining a method of operating the memory system 10 according to an example embodiment of the disclosure.

Referring to FIGS. 1, 8 and 9, the memory controller 100 may perform steps S31 and S32 to perform step S30 of FIG. 8. In step S31, the memory controller 100 may determine whether the read count of the sub-set for which the read count has been increased in step S20 has reached a first reference value N. That is, in step S31, the memory controller 100 may determine whether the read count of the sub-set is equal to or larger than the first reference value N. When the read count does not reach the first reference value N, the process may be terminated. When the read count reaches the first reference value N, the memory controller 100 may perform steps S32 and S33. In this case, the first reference value N may be a value stored in the memory controller 100 as a predetermined value.

In step S32, the memory controller 100 may send a recovery command recCMD to the memory device 200 for the sub-set whose read count has reached the first reference value N. For example, the memory controller 100 may send a recovery command recCMD and a physical address ADDR corresponding to the sub-set.

The memory device 200 may receive the recovery command recCMD, and perform a recovery operation on a sub-set corresponding to the recovery command recCMD. In step S110, the memory device 200 may provide a recovery voltage, i.e., a recovery pulse, to the sub-set. In this case, the recovery pulse may have a different voltage level or a different duration of the pulse from the set pulse and the reset pulse for writing data into the memory cell. When the recovery pulse is applied, the resistance of the memory cells included in the sub-set may be reduced, and the width of the resistance distribution may be reduced.

In step S40, the memory controller 100 may reset the read count for the sub-set. In an embodiment, steps S40 and S110 may be performed in parallel with each other.

Figure 10:
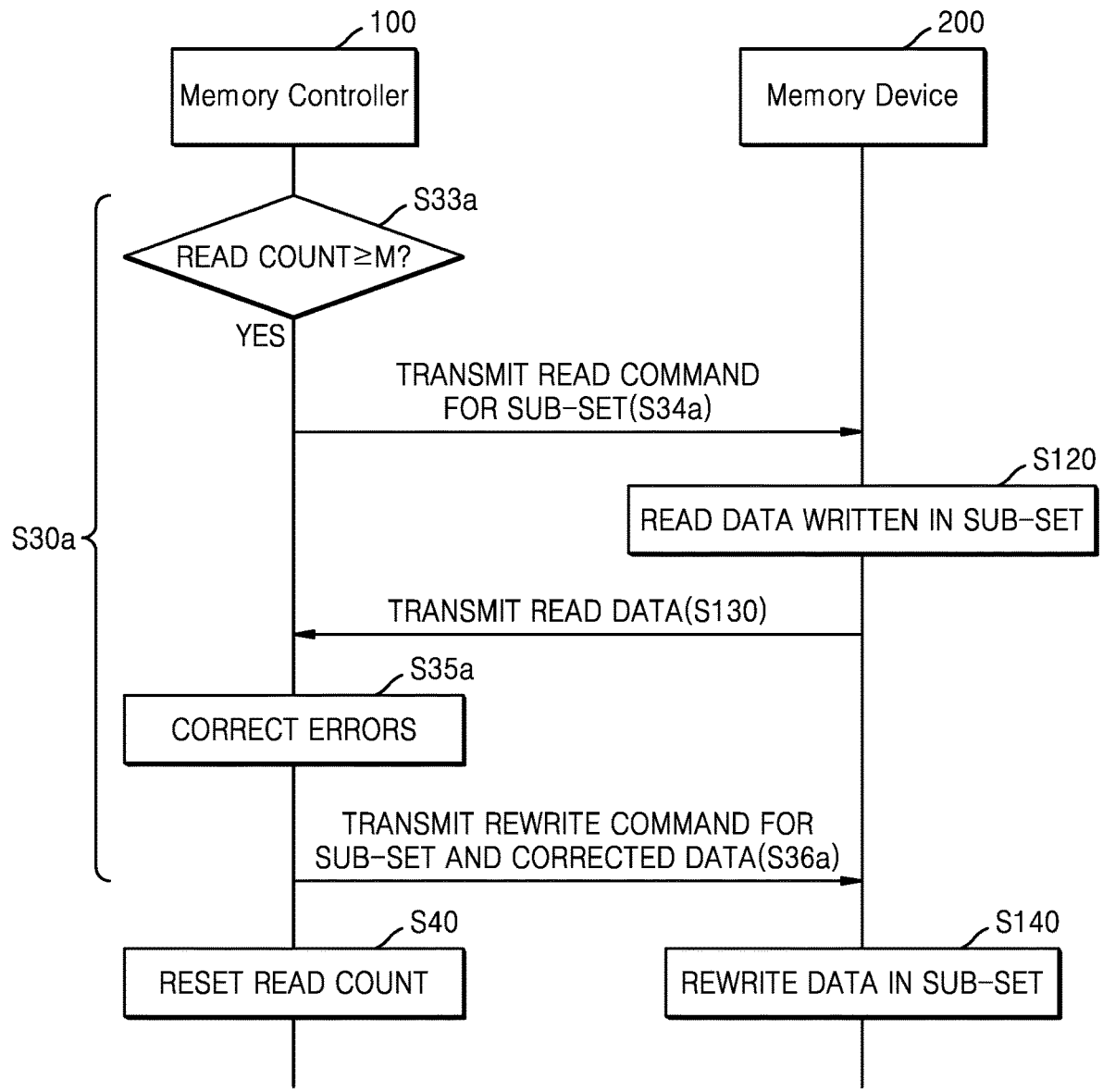
FIG. 10 is a flowchart for explaining a method of operating a memory system according to an example embodiment of the disclosure.

FIG. 10 is a flowchart for explaining a method of operating a memory system 10 according to an example embodiment of the disclosure. Step S30a of FIG. 10 may be an embodiment of step S30 of FIG. 8.

Referring to FIGS. 1, 8 and 10, the memory controller 100 may perform steps S33a to S36a to perform step S30a. In step S33a, the memory controller 100 may determine whether the read count of the sub-set for which the read count has been increased in step S20 has reached a second reference value M. That is, in step S33a, the memory controller 100 may determine whether the read count of the sub-set is equal to or larger than the second reference value M. When the read count does not reach the second reference value M, the process may be terminated. When the read count reaches the second reference value M, the memory controller 100 may perform steps S34a to S36a. In this case, the second reference value M may be a value stored in the memory controller 100 as a predetermined value, and may be the same as or different from the first reference value N in FIG. 9.

In step S34a, the memory controller 100 may transmit the read command RCMD to the memory device 200 for the sub-set in which the read count has reached the second reference value M. For example, the memory controller 100 may transmit a read command (RCMD) and a physical address (ADDR) corresponding to the sub-set.

In step S120, the memory device 200 may receive the read command RCMD and may read the data written in the corresponding sub-set. In step S130, the memory device 200 may transmit the read data to the memory controller 100.

In step S35a, the memory controller 100 may correct an error of data received from the memory device 200. For example, the memory controller 100 may correct errors in data read from a sub-set through an ECC decoding operation.

In step S36a, the memory controller 100 may transmit the rewrite command reWCMD for the sub-set and the error corrected data to the memory device 200. In this case, the memory controller 100 may transmit a physical address for the sub-set to the memory device 200 together. However, the memory device 200 and memory controller 100 may be described as performing the ECC operation, but is not limited thereto. In an embodiment, the memory device 200 may include ECC circuit therein, the memory device 200 may directly perform an ECC operation with being controlled by the memory controller 100 (for example, On-chip ECC operation).

In step S140, the memory device 200 receives the rewrite command reWCMD for the sub-set and the error corrected data, and may rewrite the corrected data in the sub-set. In this case, the rewrite operation may mean a write operation, not a compare-write operation. For example, even though the written data and the new write data are the same, the write operation may be performed by overwriting the corresponding memory cell. For example, a write pulse for a write operation may be applied to at least one of memory cells in a page included in a sub-set in which a write operation is performed, in at least one of the memory cells in which the written data and the newly write requested data are the same. For example, a write pulse for a write operation may be applied to all memory cells in a page included in a sub-set in which a write operation is performed.

However, the memory device 200 may be described as performing the rewrite operation instead of the compare-write operation, but is not limited thereto. In an embodiment, in step S36a, the memory controller 100 may send a write command WCMD for sub-set and error corrected data to the memory device 200, and in step 140, the memory device 200 may perform a compare-write operation on the corrected data in the sub-set SUB-SET.

Additionally, memory controller 100 may be described as performing the ECC operation, but is not limited thereto. The memory controller 100 may not perform the ECC operation including the ECC decoding operation and the ECC encoding operation. Accordingly, In an embodiment, in step S140, the memory device 200 may rewrite the data read in step S120 without performing the ECC operation.

In step S40, the memory controller 100 may reset the read count for the sub-set. In an embodiment, steps S40 and S140 may be performed in parallel.

Figure 11:
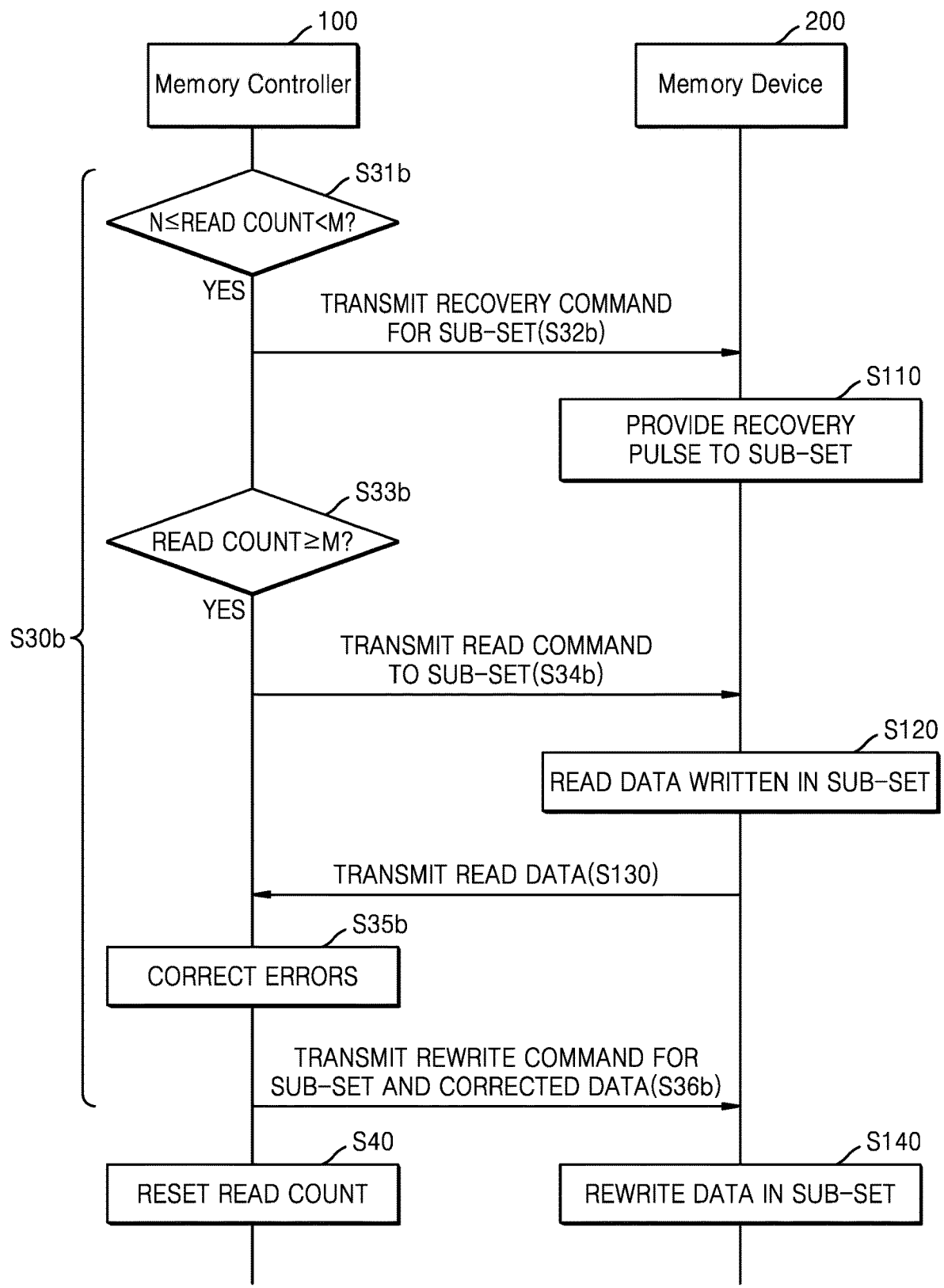
FIG. 11 is a flowchart for explaining a method of operating a memory system according to an example embodiment of the disclosure.

FIG. 11 is a flowchart for explaining a method of operating a memory system 10 according to an example embodiment of the disclosure. Step S30b of FIG. 11 may be an embodiment of step S30 of FIG. 8.

Referring to FIGS. 1, 8 and 11, the memory controller 100 may perform steps S31b to S36b to perform step S30b. In step S31b, the memory controller 100 may determine whether the read count of the sub-set increased in step S20 has reached a first reference value N. When the read count does not reach the first reference value N, the process may be terminated. When the read count reaches the first reference value N, the memory controller 100 may perform steps S32b and S33b.

In step S32b, the memory controller 100 may send a recovery command recCMD to the memory device 200 for the sub-set in which the read count has reached the first reference value N. For example, the memory controller 100 may send a recovery command recCMD and a physical address ADDR corresponding to the sub-set.

The memory device 200 may receive the recovery command recCMD to perform a recovery operation on a sub-set corresponding to the received recovery command recCMD. In step S110, the memory device 200 may provide a recovery pulse to the sub-set.

In step S33b, the memory controller 100 may determine whether the read count of the sub-set has reached a second reference value M or not. When the read count does not reach the second reference value M, the process may be terminated. When the read count reaches the second reference value M, the memory controller 100 may perform steps S34b to S36b. In this case, the second reference value M may be a value greater than the first reference value N. That is, even after the memory controller 100 performs step S32b and the memory device 200 performs step S110, steps S10 and S20 of FIG. 8 are further performed, and thus the read count for the sub-set may be increased from the first reference value N to reach the second reference value M.

In step S34b, the memory controller 100 may transmit the read command RCMD to the memory device 200 for the sub-set in which the read count reaches the second reference value M. For example, the memory controller 100 may transmit a read command RCMD and a physical address ADDR corresponding to the sub-set.

In step S120, the memory device 200 receives the read command RCMD to read the data written in a sub-set corresponding to the received read command RCMD. In step S130, the memory device 200 may transmit the read data to the memory controller 100.

In step S35b, the memory controller 100 may correct errors in the data received from the memory device 200. For example, the memory controller 100 may correct errors in data read from a sub-set through an ECC decoding operation.

In step S36b, the memory controller 100 may transmit the rewrite command reWCMD for the sub-set and the error corrected data to the memory device 200. In this case, the memory controller 100 may transmit a physical address for the sub-set to the memory device 200 together.

In step S140, the memory device 200 receives the rewrite command reWCMD for the sub-set and the error corrected data, and may rewrite the corrected data in the sub-set. In this case, the rewrite operation may mean a write operation, not a compare-write operation. For example, a write pulse for a write operation may be applied to at least one of memory cells in which corresponding the written data and the corresponding newly write requested data are the same. For example, a write pulse for a write operation may be applied to all memory cells in a page included in a sub-set in which a write operation is performed.

However, the memory device 200 may be described as performing the rewrite operation instead of the comparison and writing operation, but is not limited thereto. In an embodiment, in step S36b, the memory controller 100 may send the write command WCMD for the sub-set and the error corrected data to the memory device 200, and in step 140, the memory device 200 may perform a compare-write operation on the corrected data in the sub-set.

In step S40, the memory controller 100 may reset the read count for the sub-set. In an embodiment, steps S40 and S140 may be performed in parallel.

Figure 12:
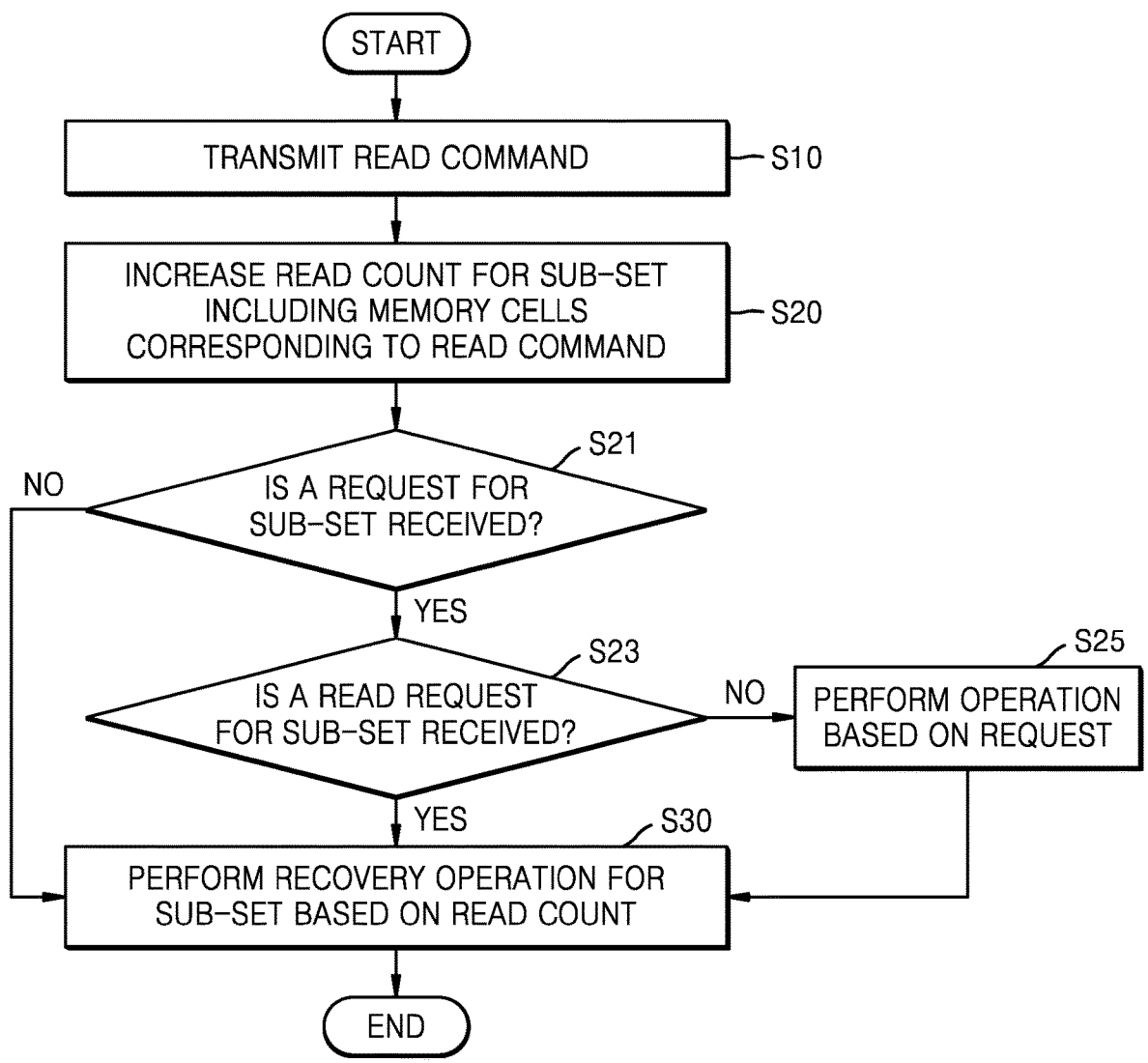
FIG. 12 is a flowchart for explaining a method of operating a memory controller according to an example embodiment of the disclosure.

FIG. 12 is a flowchart for explaining a method of operating a memory controller 100 according to an example embodiment of the disclosure. In FIG. 12, the same reference numerals as those in FIG. 8 are not repeated.

Referring to FIGS. 1 and 12, the memory controller 100 may perform steps S21, S23, and S25 before a recovery operation of step S30 is performed. In this case, step S30 may be one of step S30 of FIG. 9, step S30a of FIG. 10, and step S30b of FIG. 11.

In step S21, the memory controller 100 may check from the host HOST whether the request for the specific sub-set whose read count has been increased is received in step S20. When the request for the sub-set is not received, the memory controller 100 may perform a recovery operation based on step S30.

In step S21, the memory controller 100 may confirm whether the memory controller 100 has received a request for the sub-set from the host HOST. If a request for the sub-set from the host HOST is received, in S23, the memory controller 100 may confirm whether a read request for the sub-set from the host HOST. When a read request for a sub-set is received, the memory controller 100 may preferentially perform step S30. That is, when there is a read request for the memory cells included in the sub-set from the host HOST, the memory controller 100 may preferentially perform the recovery operation before a read operation based on the read request received from the host HOST is performed. The memory controller 100 may perform a read operation based on the read request after the recovery operation based on step S30 is completed. Since a recovery operation is performed before a read operation on the memory cells included in the sub-set is performed, reliability of data written in the sub-set may be improved. If no request for the sub-set from the host HOST is received in S21, the memory controller 100 may perform the recovery operation for the sub-set based on the read count in step S30.

When a memory controller 100 receives a request (e.g., a write request) other than a read request for a sub-set, the memory controller 100 may perform step S25. In step S25, the memory controller 100 may perform an operation for the sub-set based on a request from the host HOST. The memory controller 100 may perform step S30 after step S25 is completed. That is, when there is a request other than a read request for the memory cells included in the sub-set from the host HOST, the memory controller 100 may perform the operation based on the request, and then may perform step S30.

Although the disclosure has been described with reference to embodiments shown in the drawings, it is to be understood that various modifications and equivalent embodiments may be made by those skilled in the art without departing from the scope of the inventive concept. Accordingly, the true scope of protection of the disclosure should be determined by the technical idea of the appended claims.

While the disclosure has been particularly shown and described with reference to embodiments thereof, it will be understood that various changes in form and details may be made therein without departing from the spirit and scope of the following claims.

What is claimed is:

1. A memory system comprising:
 a memory device comprising a plurality of memory cells constituting a plurality of sub-sets; and
 a memory controller configured to:
  manage, for each of the plurality of sub-sets, a read count indicating a number of read operations performed by the memory device for the respective sub-set among the plurality of sub-sets,
  identify a sub-set, among the plurality of sub-sets, which has the read count satisfying a criteria, and
  perform a recovery operation on the identified sub-set,
 wherein each of the plurality of sub-sets comprises a plurality of pages, and
 wherein each of the plurality of pages is a unit in which a read operation is performed in the plurality of memory cells,
 wherein the memory device is configured to provide a recovery pulse to the sub-set corresponding to the read count when the read count reaches a first reference value.

2. The memory system of claim 1, wherein memory cells, among the plurality of memory cells, connected to a same word line are included in a same sub-set.

3. The memory system of claim 1, wherein the memory controller is further configured to manage a write count for a number of write operations performed by the memory device in each of the plurality of sub-sets.

4. The memory system of claim 1, wherein the recovery pulse has a different voltage level than a voltage level of a pulse for writing operation.

5. The memory system of claim 1, wherein the recovery pulse has a different pulse duration than a pulse duration of a pulse for writing operation.

6. The memory system of claim 1, wherein when the read count reaches a second reference value, the memory device is configured to read out data written in the sub-set corresponding to the read count and transmit the read data to the memory controller.

7. The memory system of claim 6, wherein the memory controller is further configured to receive data read from the sub-set, correct an error in the received data, and transmit error correction data to the memory device.

8. The memory system of claim 7, wherein the memory device is configured to write the error correction data to the sub-set corresponding to the read count.

9. The memory system of claim 8, wherein the memory device is further configured to rewrite the error correction data in the memory cell even when the read data and the error correction data are the same.

10. The memory system of claim 8, wherein the memory device is further configured to perform a data compare-write operation on the sub-set corresponding to the read count.

11. A method of operating a memory controller for controlling an operation of a memory device comprising a plurality of memory cells constituting a plurality of sub-sets, the method comprising:
    transmitting a read command to the memory device;
    increasing a read count for a sub-set, among the plurality of sub-sets, corresponding to the read command;
    determining whether the read count of the sub-set satisfies a criteria; and
    performing a recovery operation on the sub-set based on a result of the determination that the read count of the sub-set satisfies the criteria,
    wherein the sub-set comprises a plurality of pages, and
    wherein each of the plurality of pages is a unit in which a read operation is performed in the plurality of memory cells,
    wherein the performing of the recovery operation comprises:
    determining whether the read count reaches a second reference value;
    transmitting a read command for the sub-set corresponding to the read count based on a determination that the read count reaches the second reference value;
    correcting an error in data read from the sub-set; and
    transmitting a rewrite command for the sub-set and the corrected data to the memory device to allow the corrected data to be rewritten to the sub-set.

12. The method of claim 11, wherein the performing of the recovery operation comprises:
    determining whether the read count reaches a first reference value; and
    transmitting a recovery command to the memory device based on a determination that the read count reaches the first reference value.

13. The method of claim 11, further comprising resetting the read count after the performing of the recovery operation is completed.

14. The method of claim 11, further comprising confirming whether a request for the sub-set is received from a host,
    wherein the recovery operation is performed when the request for the sub-set is not received.

15. The method of claim 11, further comprising confirming whether a read request for the sub-set is received from a host,
    wherein, when the read request for the sub-set is received, an operation according to the read request is performed after the recovery operation is performed.

16. The method of claim 11, further comprising confirming whether a request for the sub-set is received from a host,
    wherein, when the request for the sub-set other than a read request is received, the recovery operation is performed after an operation according to the request is performed.

17. A memory controller for controlling a memory device comprising a plurality of memory cells constituting a plurality of sub-sets, the memory controller comprising:
    a memory configured to store one or more instruction; and
    at least one processor configured to execute the one or more instructions to:
        manage, for each of the plurality of sub-sets, a read count, which indicates a number of read commands transmitted to the memory device for the respective sub-set among the plurality of sub-sets,
    identify a sub-set, among the plurality of sub-sets, which has the read count satisfying a criteria, output an instruction to perform a recovery operation the identified sub-set,
    wherein each of the plurality of sub-sets comprises a plurality of pages, and
    wherein each of the plurality of pages is a unit in which a read operation is performed in the plurality of memory cells,
    wherein the at least one processor is further configured to:
        transmit a recovery command to the memory device such that a recovery pulse is provided to the sub-set corresponding to the read count, based on a result of the determination that the read count reaches a first reference value, and
    transmit a rewrite command such that data is rewritten in the sub-set, when the read count reaches a second reference value, and wherein the first reference value is less than the second reference value, and
    wherein memory cells connected to the same word line among the plurality of memory cells are included in the same sub-set.

* * * * *